(12) United States Patent
Wang et al.

(10) Patent No.: US 11,756,925 B2
(45) Date of Patent: Sep. 12, 2023

(54) METHODS AND APPARATUS FOR VACUUM PROCESSING A SUBSTRATE

(71) Applicant: Applied Materials, Inc., Santa Clara, CA (US)

(72) Inventors: Ying Wang, Singapore (SG); Ruiping Wang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 193 days.

(21) Appl. No.: 17/508,489

(22) Filed: Oct. 22, 2021

(65) Prior Publication Data

US 2023/0129590 A1 Apr. 27, 2023

(51) Int. Cl.
*H01L 21/00* (2006.01)
*H01L 23/00* (2006.01)
(Continued)

(52) U.S. Cl.
CPC ............ *H01L 24/95* (2013.01); *C23C 16/513* (2013.01); *H01L 21/67132* (2013.01);
(Continued)

(58) Field of Classification Search
CPC ............... H01L 24/95; H01L 21/67132; H01L 21/67253; H01L 21/6836; H01L 22/10; H01L 24/94; H01L 21/67144; H01L 22/00; H01L 22/12; H01L 2221/68327; C23C 16/513
See application file for complete search history.

(56) References Cited

U.S. PATENT DOCUMENTS

| 6,872,428 B2 | 3/2005 | Yang et al. |
| 7,585,686 B2 | 9/2009 | Verhaverbeke et al. |

(Continued)

FOREIGN PATENT DOCUMENTS

| CN | 109686674 A | 4/2019 |
| JP | 2002-334816 A1 | 11/2002 |
| KR | 10-2018-0134507 A | 12/2018 |

OTHER PUBLICATIONS

PCT International Search Report and Written Opinion for PCT/US2022/074235 dated Nov. 16, 2022.

*Primary Examiner* — John P. Dulka
(74) *Attorney, Agent, or Firm* — MOSER TABOADA

(57) ABSTRACT

Methods and apparatus for processing a substrate are provided herein. For example, a method for hybrid bonding a wafer comprises performing a first vacuum processing procedure on the wafer disposed within a first processing chamber, obtaining at least one of moisture measurements or organic species measurements within the first processing chamber, comparing the obtained at least one of moisture measurements or organic species measurements with a predetermined threshold, and one of when a comparison of the obtained at least one of moisture measurements or organic species measurements is equal to or less than the predetermined threshold automatically performing a second vacuum processing procedure in a second processing chamber different from the first processing chamber on the wafer, or when the comparison of the obtained at least one of moisture measurements or organic species measurements is greater than the predetermined threshold automatically continuing performing the first vacuum processing procedure on the wafer.

20 Claims, 3 Drawing Sheets

(51) Int. Cl.
*H01L 21/67* (2006.01)
*C23C 16/513* (2006.01)
*H01L 21/683* (2006.01)
*H01L 21/66* (2006.01)

(52) U.S. Cl.
CPC .... *H01L 21/67253* (2013.01); *H01L 21/6836* (2013.01); *H01L 22/10* (2013.01); *H01L 24/94* (2013.01)

(56) References Cited

U.S. PATENT DOCUMENTS

| | | |
|---|---|---|
| 7,985,188 B2 | 7/2011 | Felts et al. |
| 9,572,526 B2 | 2/2017 | Felts et al. |
| 10,201,660 B2 | 2/2019 | Weikart et al. |
| 2015/0048523 A1 | 2/2015 | Suga et al. |
| 2015/0243537 A1 | 8/2015 | Chen et al. |
| 2018/0350639 A1 | 12/2018 | Lin et al. |

METHODS AND APPARATUS FOR VACUUM PROCESSING A SUBSTRATE

FIELD

Embodiments of the disclosure generally relate to methods and apparatuses for. For example, embodiments of the disclosure relate to methods and apparatus that use endpoint detection with a residual gas analyzer (RGA) for Chip-on-Wafer (CoW) hybrid bonding.

BACKGROUND

Conventional tape-frame wafers used in CoW hybrid bonding release an extensive amount of outgas, e.g., moisture, $CO_x$, $CO_2$, $H_2O$, and organic species ($C_xH_x$, plasticizer, etc.) when loaded in a plasma chamber for surface activation. The outgassing can result in a variety of issues, which can include, but is not limited to, slow pumping down process, poor chamber base pressure, and chamber contamination. Accordingly, one or more degas processes is often used before the plasma step to mitigate such issues. However, the duration can vary largely due to mix-run (e.g., due to CoW's "mix-and-bond" process of KGDs) of different incoming tape materials, upstream process/staging conditions, and/or wafer quantity in one single batch run.

A capability of inline outgas monitoring and endpoint detection using RGA, and real-time feedback for automatic degas duration tuning is desirable. Temperature measurement, however, in a vacuum is challenging due to a lack of a conduction/convection medium. Conventional methods and apparatus utilize non-contact infrared (NC-IR) sensors. For example, in degas processes, which usually operate in high vacuum, temperature measurement and control rely on NC-IR sensors. However, such sensors are emissivity-dependent and, thus, material dependent. As such, iterative manual calibrations using, for example, temperature stickers need to be performed prior to degas processing different substrate materials, which is slow, not performed in real-time, and less sensitive to outgas.

SUMMARY

Methods and apparatus for processing a substrate are provided herein. In some embodiments, for example, a method for hybrid bonding a wafer comprises performing a first vacuum processing procedure on the wafer disposed within a first processing chamber, obtaining at least one of moisture measurements or organic species measurements within the first processing chamber, comparing the obtained at least one of moisture measurements or organic species measurements with a predetermined threshold, and one of when a comparison of the obtained at least one of moisture measurements or organic species measurements is equal to or less than the predetermined threshold automatically performing a second vacuum processing procedure in a second processing chamber different from the first processing chamber on the wafer, or when the comparison of the obtained at least one of moisture measurements or organic species measurements is greater than the predetermined threshold automatically continuing performing the first vacuum processing procedure on the wafer.

In accordance with at least some embodiments, a non-transitory computer readable storage medium has instructions stored thereon that, when executed by a processor, cause a method for hybrid bonding a wafer to be performed. The method comprises performing a first vacuum processing procedure on the wafer disposed within a first processing chamber, obtaining at least one of moisture measurements or organic species measurements within the first processing chamber, comparing the obtained at least one of moisture measurements or organic species measurements with a predetermined threshold, and one of when a comparison of the obtained at least one of moisture measurements or organic species measurements is equal to or less than the predetermined threshold automatically performing a second vacuum processing procedure in a second processing chamber different from the first processing chamber on the wafer, or when the comparison of the obtained at least one of moisture measurements or organic species measurements is greater than the predetermined threshold automatically continuing performing the first vacuum processing procedure on the wafer.

In accordance with at least some embodiments, an integrated tool for hybrid bonding a wafer comprises a first processing chamber configured to perform a first vacuum processing procedure, a second processing chamber different from the first processing chamber and configured to perform a second vacuum processing procedure, and a controller configured to obtain at least one of moisture measurements or organic species measurements within the first processing chamber and the second processing chamber, compare the obtained at least one of moisture measurements or organic species measurements with a predetermined threshold, and one of when a comparison of the obtained at least one of moisture measurements or organic species measurements is equal to or less than the predetermined threshold automatically perform the second vacuum processing procedure in the second processing chamber on the wafer, or when the comparison of the obtained at least one of moisture measurements or organic species measurements is greater than the predetermined threshold automatically continue performing the first vacuum processing procedure on the wafer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
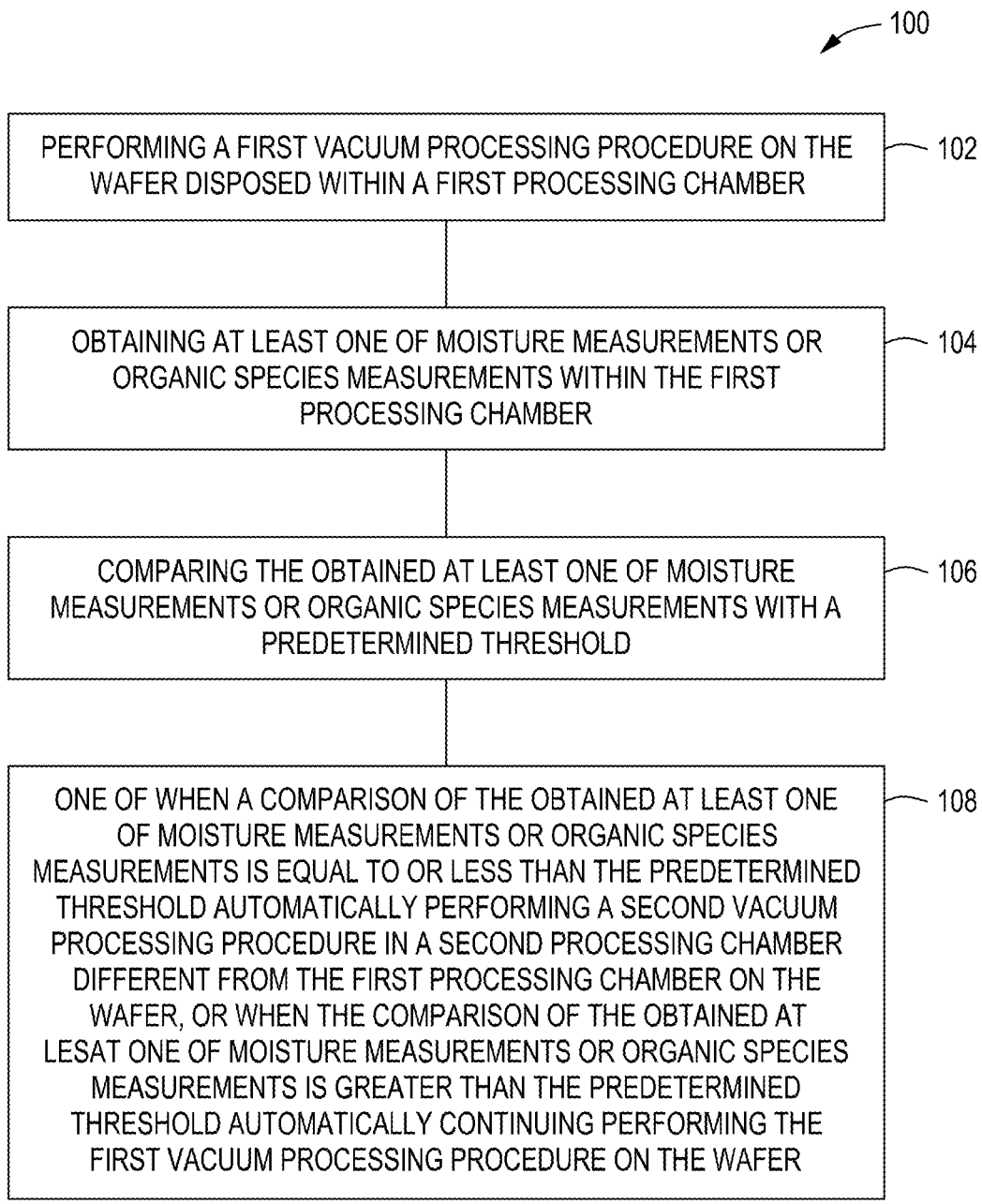
FIG. 1 is a flowchart of a method of processing a substrate, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, the methods and apparatus described herein are configured for prebonding treatments of a diced wafer on a tape frame and the substrates to which the dies are to be bonded to. For example, in at least some embodiments, a method can comprise a predetermined/preset threshold (endpoint), which can be based on downstream process requirements. One or more apparatus can be used to measure/monitor a content of outgas, e.g., moisture, $CO_x$, and organic species in a processing chamber (e.g., degas processing chamber, plasma processing chamber, etc.). In at least some embodiments, a residual gas analyzer (RGA) can be used to measure/monitor the content of moisture, $CO_x$, and organic species during operation. An RGA signal can then be compared with the predetermined/preset threshold, and additional processing (e.g., degas cycles/duration) can be automatically triggered if the predetermined threshold is not met. The methods and apparatus described herein, enable inline real-time process monitoring. Thus, the methods and apparatus described herein can provide reliable and flexible degas mix-run for different incoming tape materials, improved upstream process/staging conditions, and increased substrate (wafer) throughput in a relatively simple and cost efficient manner.

Figure 2:
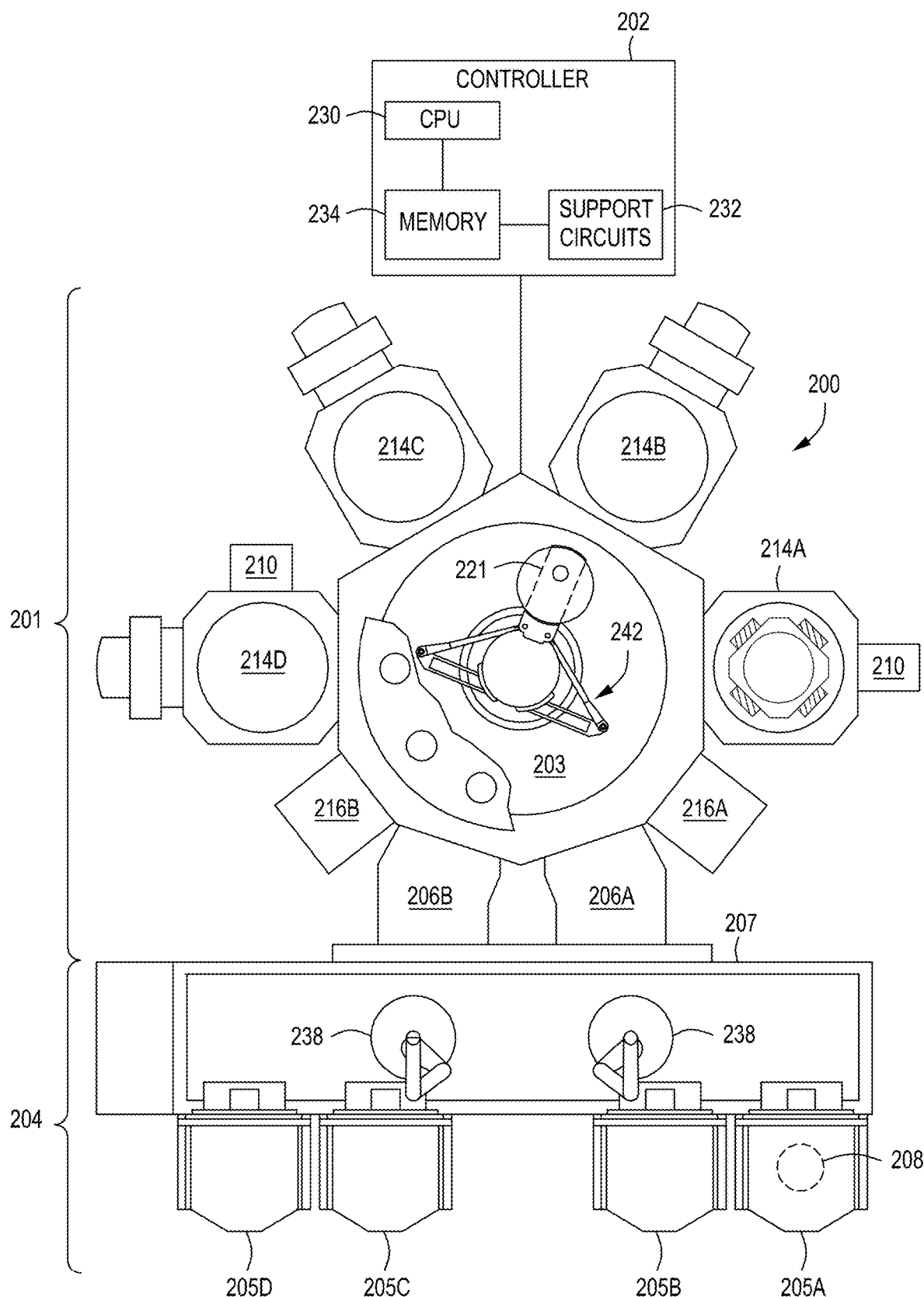
FIG. 2 is a system for performing the method of FIG. 1, in accordance with at least some embodiments of the present disclosure.

FIG. 1 is a flowchart of a method 100 for processing a substrate (e.g., a diced wafer on a tape frame), and FIG. 2 is a tool 200 (or system) that can used for carrying out the method 100, in accordance with at least some embodiments of the present disclosure.

The method 100 may be performed in a tool 200 including any suitable processing chamber configured for one or more of physical vapor deposition (PVD), chemical vapor deposition (CVD), atomic layer deposition (ALD), such as plasma enhanced ALD or thermal ALD (e.g., no plasma formation), degas procedure, cleaning procedures, backgrinding procedures, tape mounting procedures, dicing procedures, ultra-violet procedure, etc. Exemplary processing systems that may be used to perform the inventive methods disclosed herein may include, but are not limited to, those processing systems commercially available from Applied Materials, Inc., of Santa Clara, Calif. Other processing chamber, including those from other manufacturers, may also be suitably used in connection with the teachings provided herein.

The tool 200 can be embodied in individual processing chamber that may be provided in a standalone configuration or as part of a cluster tool, for example, an integrated tool, described below with respect to FIG. 2. Examples of the integrated tool include the line of integrated tools, available from Applied Materials, Inc., of Santa Clara, Calif. The methods described herein may be practiced using other cluster tools having suitable processing chamber coupled thereto, or in other suitable processing chamber. For example, in some embodiments, the inventive methods discussed herein may be performed in an integrated tool such that there are limited or no vacuum breaks between processing steps.

The integrated tool can include a vacuum-tight processing platform (mainframe) or an atmospheric mainframe (AMM), which a vacuum buffer can be connected to, (processing platform 201), a factory interface 204, and a system controller 202. For illustrative purposes, the tool 200 is described herein as a vacuum-tight processing platform. The processing platform 201 comprises multiple processing chamber, such as 214A, 214B, 214C, and 214D operatively coupled to a transfer chamber 203 (vacuum substrate transfer chamber). The factory interface 204 is operatively coupled to the transfer chamber 203 by one or more load lock chambers (two load lock chambers, such as 206A and 206B shown in FIG. 2).

In some embodiments, the factory interface 204 comprises a docking station 207, a factory interface robot 238 to facilitate the transfer of one or more semiconductor substrates (wafers). The docking station 207 is configured to accept one or more front opening unified pod (FOUP, for substrates) and EFEM (for tape-frame wafers). Four FOUPS, such as the carriers 205A, 205B, 205C, and 205D, are shown in the embodiment of FIG. 2. The factory interface robot 238 is configured to transfer the substrates from the factory interface 204 to the processing platform 201 through the load lock chambers, such as load lock chambers 206A and 206B. Each of the load lock chambers 206A and 206B have a first port coupled to the factory interface 204 and a second port coupled to the transfer chamber 203. The load lock chamber 206A and 206B are coupled to a pressure control system (not shown) which pumps down and vents the load lock chambers 206A and 206B to facilitate passing the substrates between the vacuum environment of the transfer chamber 203 and the substantially ambient (e.g., atmospheric) environment of the factory interface 204. The transfer chamber 203 has a vacuum robot 242 disposed within the transfer chamber 203. The vacuum robot 242 is capable of transferring substrates 221 between the load lock chamber 206A and 206B and the processing chamber 214A, 214B, 214C, and 214D.

In some embodiments, the processing chamber 214A, 214B, 214C, and 214D, are coupled to the transfer chamber 203. The processing chambers 214A, 214B, 214C, and 214D comprise at least an ALD chamber, a CVD chamber, a PVD chamber, an e-beam deposition chamber, and/or an electroplating, electroless (EEP) deposition chamber.

In some embodiments, one or more optional service chambers (shown as service chambers 216A and 216B) may be coupled to the transfer chamber 203. The service chambers 216A and 216B may be configured to perform other substrate processes, such as degassing, ultra-violet release, backgrinding, tape mounting hybrid bonding, chemical mechanical polishing (CMP), wafer cleaving, etching, plasma dicing, cleaning (e.g., wet process), orientation, substrate metrology, cool down and the like.

The system controller 202 controls the operation of the tool 200 using a direct control of the processing chambers 214A, 214B, 214C, and 214D or alternatively, by controlling the computers (or controllers) associated with the processing chambers 214A, 214B, 214C, and 214D and the tool 200. In operation, the system controller 202 enables data collection and feedback from the respective chambers and systems to optimize performance of the tool 200. The system controller 202 generally includes a central processing unit 230, a memory 234, and a support circuit 232. The memory 234 can be a non-transitory computer readable storage medium having instructions stored thereon that, when executed by a processor, cause a method for hybrid bonding a wafer to be performed, as described in more detail below. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 and, when executed by the central processing unit 230, transform the central processing unit 230 into a system controller 202 (specific purpose computer). The software routines may also be stored and/or executed by a second controller (not shown) that is located remotely from the tool 200.

Continuing with reference to FIG. 1, initially one or more substrates, tape-frame wafers, or the like may be loaded into one or more of the four carriers, such as carriers 205A, 205B, 205C, and 205D. For example, in at least some embodiments, a tape-frame substrate (wafer) 208 can be loaded into carrier 205A. The tape-frame substrate 208 can be made from one or more suitable materials. For example, the tape-frame substrate (wafer) can be made from a polymeric material (e.g., a tape-frame wafer with singulated dies on a polymeric/acrylic material or a wafer coated by a polymer/dielectric material).

Figure 3:
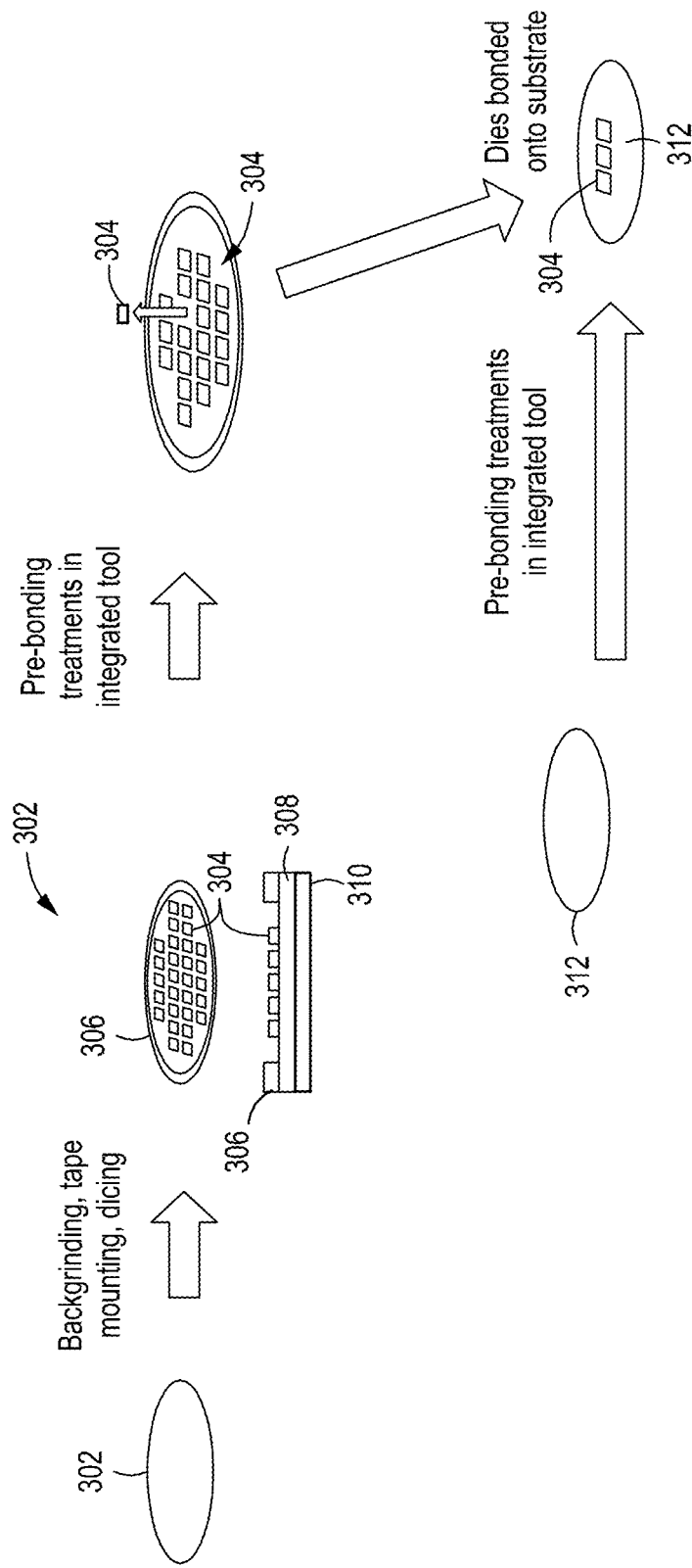
FIG. 3 is a sequencing diagram of the method of FIG. 1, in accordance with at least some embodiments of the present disclosure.

Alternatively, a tape-frame wafer can be formed using the tool 200. For example, as illustrated in FIG. 3, in at least some embodiments, an un-diced wafer 302 (e.g., silicon oxide ($SiO_2$ on Si, polymer-coated, with $SiO_2$, gallium arsenide (GaAs), etc., with or without copper (Cu) patterns) can be loaded into the four carriers, such as carriers 205A, 205B, 205C, and 205D. Once loaded, the factory interface robot 238 can transfer the tape-frame substrate 208 and/or the un-diced wafer 302 from the factory interface 204 to the processing platform 201 through, for example, the load lock chamber 206A. The vacuum robot 242 can transfer the tape-frame substrate 208 and/or the un-diced wafer 302 from the load lock chamber 206A to and from one or more of the processing chamber 214A-214D and/or the service chambers 216A and 216B.

For example, in at least some embodiments, such as when the un-diced wafer 302 is loaded into one of the four carriers, the vacuum robot 242 can transfer the tape-frame substrate 208 from the load lock chamber 206A to one of the service chambers 216A and 216B to perform one or more optional procedures on the un-diced wafer 302. For example, the one or more optional procedures can comprise performing at least one of a backgrinding procedure, a tape mounting procedure, or a dicing procedure to form the un-diced wafer 302 into the tape-frame wafer (e.g., to comprise a plurality of singulated die 304, a metal frame 306, an adhesive layer 308, and an organic tape layer 310. In at least some embodiments, the adhesive layer 308 can be disposed on top of the organic tape layer 310 on which the plurality of singulated die 304 and the metal frame 306 are disposed. Alternatively or additionally, an optional cleaning procedure can also be performed on the un-diced wafer 302.

Similarly, when the tape-frame substrate 208 is loaded into one of the four carriers, the vacuum robot 242 can transfer the tape-frame substrate 208 from the load lock chamber 206A to one of the service chambers 216A and 216B to perform one or more optional procedures on the tape-frame substrate 208. For example, the one or more optional procedures can comprise performing an optional cleaning procedure on the tape-frame substrate 208.

As noted above, tape-frame substrates that are used in CoW hybrid bonding can release extensive amounts of moisture, $CO_x$, $CO_2$, $H_2O$, and/or organic species ($C_xH_x$, plasticizer, etc.) when loaded into a plasma chamber for surface activation, which can result in a variety of issues, including but not limited to, a slow pumping down procedure, poorer chamber base pressure, chamber contamination, etc. A degas procedure can be used prior to the plasma procedure to mitigate such issues.

Accordingly, next, at 102, the method 100 can comprise performing a first vacuum processing procedure on a substrate disposed within a first processing chamber. For example, in at least some embodiments, the vacuum robot 242 can transfer the tape-frame substrate 208 from the one of the service chambers 216A and 216B to one of the processing chambers 214A-214D, which can be configured to perform a degas procedure and/or a plasma procedure.

Next, at 104, the method 100 can comprise obtaining at least one of moisture measurements or organic species measurements within the first processing chamber. For example, one or more apparatus can be coupled to or disposed within the processing chambers 214A-214D and configured to obtain moisture measurements or organic species measurements. In at least some embodiments, an RGA 210 can be used to obtain moisture measurements and/or organic species measurements. The RGA 210 can be operably coupled (attached) to one of the processing chambers 214A-214D (e.g., processing chamber 214A) via one or more coupling methods or apparatus, e.g., adhesives, bonding processes, fasteners, etc. The RGA 210 may be any suitable RGA capable of obtaining the moisture measurements and/or the organic species measurements. For example, in at least some embodiments, the RGA 210 can be an INFICON Transpector® CPM 3.0 RGA with suitable orifice and inlet configurations.

Next, at 106, the method 100 comprises comparing the obtained at least one of moisture measurements or organic species measurements with a predetermined threshold. For example, the predetermined threshold can be determined based on at least one of a chamber baseline value associated with a plurality of different wafers or a change in a slope. In at least some embodiments, the plurality of different wafers can comprise diced silicon oxide/silicon ($SiO_2$/Si) wafers on tape material A, polymer-coated Si wafers diced on tape material B, or diced gallium arsenic (GaAs) wafers on tape material C, each of which has a predetermined baseline value. Thus, in at least some embodiments, when processing a plurality of different substrates (e.g., a plurality of different types of wafer), the predetermined baseline value can be the lowest predetermined baseline value of all the predetermined baseline values of the plurality of different substrates. Alternatively or additionally, an average or median of all the predetermined baseline values of the plurality of different substrates can be calculated and used during processing.

Next, at 108, the method 100 comprises one of when a comparison of the obtained at least one of moisture measurements or organic species measurements is equal to or less than the predetermined threshold automatically performing a second vacuum processing procedure in a second processing chamber different from the first processing chamber on the substrate, or when the comparison of the obtained at least one of moisture measurements or organic species measurements is greater than the predetermined threshold automatically continuing performing the first vacuum processing procedure on the substrate.

For example, when a moisture measurement/organic species measurement is equal to or less than a lowest predetermined baseline value, the process for which the moisture measurement/organic species measurement was taken ends. Similarly, with respect to the slope, a slope can be calculated based on all the predetermined baseline values of the plurality of different substrates (e.g., a log of all the predetermined baseline values), and when a calculated slope of the moisture measurement/organic species measurement is equal to or less then the calculated slope, the process for which the moisture measurement/organic species measurement was taken ends.

Conversely, when a moisture measurement/organic species measurement is greater than the lowest predetermined baseline value, the process for which the moisture measurement/organic species measurement was taken continues (e.g., cycles or process time continues) until the moisture measurement/organic species measurement is equal to or less then lowest predetermined baseline value.

Next, the vacuum robot 242 (or an atmospheric robot for an atmospheric mainframe) can transfer the tape-frame substrate 208 from one of the processing chambers 214A-214D to another one of the processing chambers 214A-214D (e.g., the processing chamber 214D) to perform the second vacuum processing procedure (e.g., plasma procedure) or additional vacuum processing procedures ($n^{th}$ vacuum processing procedures), in which 104-108 can be repeated. In at least some embodiments, the method 100 comprises optionally performing a cleaning procedure on the substrate after the second vacuum processing procedure or the additional vacuum processing procedures.

For example, in at least some embodiments, when the second vacuum processing procedure is performed, the method 100 comprises performing a third vacuum processing procedure on the substrate and repeating 104-108. In at least some embodiments, after the third vacuum processing procedure ends, a fourth vacuum processing procedure can be performed. For example, the vacuum robot 242 can transfer the tape-frame substrate 208 to and from the service chambers 216A and 216B and/or the processing chambers 214A-214D as needed. For example, in at least some embodiments, the third vacuum processing procedure and the fourth vacuum processing procedure can respectively be an ultra-violet procedure and a pick-and-place (PnP) procedure.

For example, in at least some embodiments, the PnP procedure can comprise picking up one or more of the dies and placing the one or more dies on a substrate 312 (e.g., an un-diced wafer) that has been previously loaded into the tool 200 (FIG. 3).

Similarly, 104-108 can be performed during an outgas procedure (measurement) in the processing platform 201 (e.g., both an atmospheric mainframe and a vacuum mainframe). For example, in at least some embodiments, an outgas procedure can be performed prior to or after any of the above-described vacuum processing procedures.

Moreover, in at least some embodiments, the methods/apparatus described herein can be used on the AMM and the vacuum buffer to detect cross contamination between process modules by outgas from wafers. Such outgas can be chemicals from, for example, a wet clean module (e.g., chemical cleaning and insufficient drying after the wet clean) and/or outgas from the degassed/plasma-treated wafers (e.g., because the wafer can be hot and keeps outgassing shortly after processes).

While the foregoing is directed to embodiments of the present disclosure, other and further embodiments of the disclosure may be devised without departing from the basic scope thereof.

The invention claimed is:

1. A method for hybrid bonding a wafer, comprising:
performing a first vacuum processing procedure on the wafer disposed within a first processing chamber;
obtaining at least one of moisture measurements or organic species measurements within the first processing chamber;
comparing the obtained at least one of moisture measurements or organic species measurements with a predetermined threshold; and
one of when a comparison of the obtained at least one of moisture measurements or organic species measurements is equal to or less than the predetermined threshold automatically performing a second vacuum processing procedure in a second processing chamber different from the first processing chamber on the wafer, or when the comparison of the obtained at least one of moisture measurements or organic species measurements is greater than the predetermined threshold automatically continuing performing the first vacuum processing procedure on the wafer.

2. The method of claim 1, wherein the predetermined threshold is determined based on at least one of a chamber baseline value associated with a plurality of different types of wafer or a change in a slope.

3. The method of claim 1, wherein the moisture measurements are obtained for at least one of $CO_x$, $CO_2$, or $H_2O$, and
wherein the organic species measurements are obtained for at least one of $C_xH_x$ or plasticizer.

4. The method of claim 1, wherein obtaining the at least one of moisture measurements or organic species measurements is performed using a residual gas analyzer (RGA).

5. The method of claim 1, wherein hybrid bonding comprises chip-on-wafer hybrid bonding.

6. The method of claim 1, wherein the wafer is a tape-frame wafer comprised of singulated dies attached to an organic tape through adhesive.

7. The method of claim 1, wherein the first vacuum processing procedure is a degas procedure, and
wherein the second vacuum processing procedure is a plasma procedure.

8. The method of claim 1, further comprising, prior to performing the first vacuum processing procedure on the wafer, performing at least one of a backgrinding procedure, a tape mounting procedure, or a dicing procedure on the wafer.

9. The method of claim 8, further comprising, after performing the at least one of the backgrinding procedure, the tape mounting procedure, or the dicing procedure on the wafer, performing a cleaning procedure on the wafer.

10. The method of claim 1, further comprising, when the second vacuum processing procedure is performed, performing a cleaning procedure on the wafer after the second vacuum processing procedure.

11. The method of claim 1, further comprising, when the second vacuum processing procedure is performed, performing a third vacuum processing procedure on the wafer; and
repeating:
obtaining at least one of moisture measurements or organic species measurements within a third processing chamber different from the first processing chamber and the second processing chamber;
comparing the obtained at least one of moisture measurements or organic species measurements with the predetermined threshold; and
one of when the comparison of the obtained at least one of moisture measurements or organic species measurements is equal to or less than the predetermined threshold automatically performing a fourth vacuum processing procedure in a fourth processing chamber different from the first processing chamber, the second processing chamber, and the third processing chamber, or when the comparison of the obtained at least one of moisture measurements or organic species measurements is greater than the predetermined threshold automatically continuing performing the third vacuum processing procedure on the wafer.

12. The method of claim 11, wherein the third vacuum processing procedure and the fourth vacuum processing procedure are respectively an ultra-violet procedure and a pick-and-place (PnP) procedure.

13. A non-transitory computer readable storage medium having instructions stored thereon that, when executed by a processor, cause a method for hybrid bonding a wafer to be performed, the method comprising:
   performing a first vacuum processing procedure on the wafer disposed within a first processing chamber;
   obtaining at least one of moisture measurements or organic species measurements within the first processing chamber;
   comparing the obtained at least one of moisture measurements or organic species measurements with a predetermined threshold; and
   one of when a comparison of the obtained at least one of moisture measurements or organic species measurements is equal to or less than the predetermined threshold automatically performing a second vacuum processing procedure in a second processing chamber different from the first processing chamber on the wafer, or when the comparison of the obtained at least one of moisture measurements or organic species measurements is greater than the predetermined threshold automatically continuing performing the first vacuum processing procedure on the wafer.

14. The non-transitory computer readable storage medium of claim 13, wherein the predetermined threshold is determined based on at least one of a chamber baseline value associated with a plurality of different types of wafer or a change in a slope.

15. The non-transitory computer readable storage medium of claim 13, wherein the moisture measurements are obtained for at least one of $CO_x$, $CO_2$, or $H_2O$, and
   wherein the organic species measurements are obtained for at least one of $C_xH_x$ or plasticizer.

16. The non-transitory computer readable storage medium of claim 13, wherein obtaining the at least one of moisture measurements or organic species measurements is performed using a residual gas analyzer (RGA).

17. The non-transitory computer readable storage medium of claim 13, wherein hybrid bonding comprises chip-on-wafer hybrid bonding.

18. The non-transitory computer readable storage medium of claim 13, wherein the wafer is a tape-frame wafer comprised of singulated dies attached to an organic tape through adhesive.

19. The non-transitory computer readable storage medium of claim 13, wherein the first vacuum processing procedure is a degas procedure, and
   wherein the second vacuum processing procedure is a plasma procedure.

20. An integrated tool for hybrid bonding a wafer, comprising:
   a first processing chamber configured to perform a first vacuum processing procedure;
   a second processing chamber different from the first processing chamber and configured to perform a second vacuum processing procedure; and
   a controller configured to:
      obtain at least one of moisture measurements or organic species measurements within the first processing chamber and the second processing chamber;
      compare the obtained at least one of moisture measurements or organic species measurements with a predetermined threshold; and
      one of when a comparison of the obtained at least one of moisture measurements or organic species measurements is equal to or less than the predetermined threshold automatically perform the second vacuum processing procedure in the second processing chamber on the wafer, or when the comparison of the obtained at least one of moisture measurements or organic species measurements is greater than the predetermined threshold automatically continue performing the first vacuum processing procedure on the wafer.

* * * * *